US012668524B2

(12) United States Patent
Nagano et al.

(10) Patent No.: US 12,668,524 B2
(45) Date of Patent: Jun. 30, 2026

(54) GLASS AND METHOD FOR MANUFACTURING GLASS

(71) Applicant: AGC Inc., Tokyo (JP)

(72) Inventors: Mikio Nagano, Chiyoda-ku (JP); Seiji Inaba, Chiyoda-ku (JP); Rikiya Kado, Chiyoda-ku (JP); Kiyoshi Tamai, Chiyoda-ku (JP); Yuha Kobayashi, Chiyoda-ku (JP)

(73) Assignee: AGC Inc., Tokyo (JP)

( * ) Notice: Subject to any disclaimer, the term of this patent is extended or adjusted under 35 U.S.C. 154(b) by 706 days.

(21) Appl. No.: 18/049,853

(22) Filed: Oct. 26, 2022

(65) Prior Publication Data

US 2023/0135358 A1 May 4, 2023

(30) Foreign Application Priority Data

Oct. 29, 2021    (JP) ................................. 2021-177369
Sep. 22, 2022    (JP) ................................. 2022-151775

(51) Int. Cl.
*C03C 3/085*      (2006.01)
*C03C 3/062*      (2006.01)
*H01L 21/56*      (2006.01)
*H10W 74/01*      (2026.01)

(52) U.S. Cl.
CPC .............. *C03C 3/085* (2013.01); *C03C 3/062* (2013.01); *H10W 74/019* (2026.01)

(58) Field of Classification Search
CPC .............. H01L 21/568; H01L 21/6835; H01L 2221/68372; C03C 3/085; C03C 3/062; C03C 3/091; C03C 3/064
See application file for complete search history.

(56) References Cited

U.S. PATENT DOCUMENTS

2018/0222787 A1*   8/2018   Hanawa ................ H01L 21/683
2021/0032155 A1*   2/2021   Inaba ...................... C03C 3/097

FOREIGN PATENT DOCUMENTS

| CN | 109923083 A | 6/2019 | |
|----|----|----|----|
| JP | 2000-187828 A | 7/2000 | |
| JP | 2005-145813 A | 6/2005 | |
| JP | 6443668 B2 | 12/2018 | |
| JP | 6715381 B1 * | 7/2020 | ............. H01L 23/15 |

(Continued)

*Primary Examiner* — Laura A Auer

(74) *Attorney, Agent, or Firm* — Oblon, McClelland, Maier & Neustadt, L.L.P.

(57) ABSTRACT

Glass contains, in mol percentage on an oxide basis, $SiO_2$: 35% to 60%, $B_2O_3$: 0.8% to 8%, $Al_2O_3$: 6% to 21%, and MgO: 17% to 44%. Additionally, $(MgO/Al_2O_3) \geq 1$ is satisfied, a measured Madelung constant m calculated by an expression (1A) is equal to or larger than 1.05, and a thermal expansion factor as a ratio of a measured value $\alpha$ of a linear thermal expansion coefficient to a calculated value $\alpha_{cal}$ of a linear thermal expansion coefficient calculated from composition is equal to or smaller than 0.7. Herein, E is a measured value of a Young's modulus of the glass, $V_p$ is an average atomic packing factor of the glass, and $G_t$ is average bond dissociation energy of the glass.

9 Claims, 2 Drawing Sheets

(56)  References Cited

FOREIGN PATENT DOCUMENTS

| JP | 2021-20840 A | 2/2021 |
| TW | 200530140 A | 9/2005 |
| TW | 201910284 A | 3/2019 |
| WO | WO-2018/025727 A1 | 2/2018 |
| WO | WO-2018/088563 A1 | 5/2018 |
| WO | WO-2019/021672 A1 | 1/2019 |

\* cited by examiner

GLASS AND METHOD FOR MANUFACTURING GLASS

CROSS-REFERENCE TO RELATED APPLICATIONS

The present application claims priority to and incorporates by reference the entire contents of Japanese Patent Application No. 2021-177369 filed in Japan on Oct. 29, 2021 and Japanese Patent Application No. 2022-151775 filed in Japan on Sep. 22, 2022.

BACKGROUND OF THE INVENTION

1. Field of the Invention

The present invention relates to glass and a method for manufacturing the glass.

2. Description of the Related Art

Glass may be used as a member for supporting a semiconductor device during a manufacturing process for the semiconductor device. For example, Japanese patent No. 6443668 discloses a support glass substrate the average linear thermal expansion coefficient of which in a temperature range from 20° C. to 200° C. is larger than $28\times10^{-7}/°$ C. and smaller than $50\times10^{-7}/°$ C.

Herein, there is a demand for suppressing deflection of glass used for supporting a semiconductor device, for example.

The present disclosure is made in view of such a situation, and provides glass and a method for manufacturing the glass that can suppress deflection.

SUMMARY OF THE INVENTION

It is an object of the present invention to at least partially solve the problems in the conventional technology.

A glass of the present disclosure contains:
SiO$_2$: 35% to 60%;
B$_2$O$_3$: 0.8% to 8%;
Al$_2$O$_3$: 6% to 21%; and
MgO: 17% to 44%,
in mol percentage on an oxide basis, wherein (MgO/Al$_2$O$_3$)≥1 is satisfied, a measured Madelung constant m calculated by an expression (1A) is equal to or larger than 1.05, and a thermal expansion factor as a ratio of a measured value a (ppm/K) of a linear thermal expansion coefficient to a calculated value $\alpha_{cal}$ (ppm/K) of the linear thermal expansion coefficient calculated from composition is equal to or smaller than 0.7, where E is a measured value of a Young's modulus (GPa) of the glass, V$_p$ is an average atomic packing factor of the glass, and G$_t$ is average bond dissociation energy of the glass.

$$m = E/(2 \cdot V_p \cdot G_t) \qquad (1A)$$

A method of manufacturing glass of the present disclosure comprises: shaping glass, the glass containing:
SiO$_2$: 35% to 60%,
B$_2$O$_3$: 0.8% to 8%,
Al$_2$O$_3$: 6% to 21%, and
MgO: 17% to 44%,
in mol percentage on an oxide basis;
holding the shaped glass at a temperature higher than a glass transition point Tg by a temperature equal to or higher than 0° C. and equal to or lower than 100° C. for a time longer than 0 hours and equal to or shorter than 10 hours; and cooling the glass so that a temperature lowering speed is equal to or higher than 0.5° C./min and equal to or lower than 100° C./min.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes a preferred embodiment of the present invention in detail with reference to the attached drawings. The present invention is not limited to the embodiment, and in a case in which there are a plurality of embodiments, the embodiments may be combined with each other. Numerical values encompass rounded numerical values.

Glass

Figure 1:
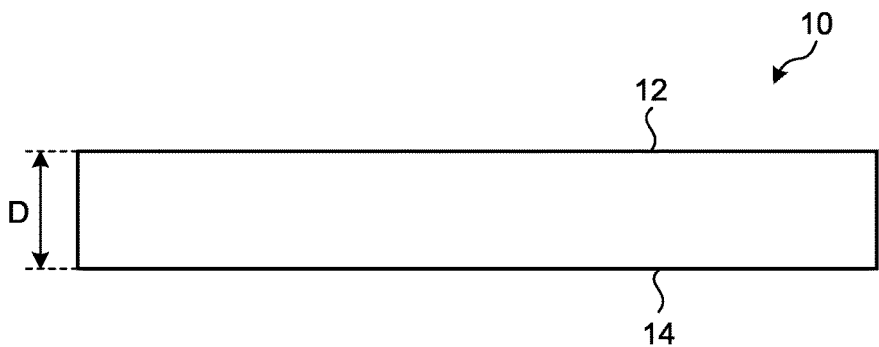
FIG. 1 is a schematic diagram of glass according to an embodiment.

FIG. 1 is a schematic diagram of glass according to the present embodiment. As illustrated in FIG. 1, glass 10 according to the present embodiment is used as a glass substrate for manufacturing a semiconductor package, more specifically, a support glass substrate for manufacturing a FOWLP and the like. However, a use of the glass 10 is not limited to manufacture of the FOWLP and the like, but is optional. The glass 10 may be a glass substrate used for supporting a member, or may be used for a use other than supporting a member. The FOWLP and the like include a Fan Out Wafer Level Package (FOWLP) and a Fan Out Panel Level Package (FOPLP).

Composition of Glass

In mole percentage on an oxide basis, assuming that a total amount of the glass 10 is 100%, the glass 10 contains 35% to 60% of SiO$_2$, 0.8% to 8% of B$_2$O$_3$, 6% to 21% of Al$_2$O$_3$, and 17% to 44% of MgO. In mole percentage on an oxide basis, the glass 10 preferably contains 0.3% or more of at least one of TiO$_2$ and ZrO$_2$, and more preferably contains equal to or more than 0.3% and equal to or less than 8% thereof.

Regarding the glass 10, in a molar ratio on an oxide basis, a ratio of a content of MgO to a content of Al$_2$O$_3$ is preferably equal to or larger than 1 ((MgO/Al$_2$O$_3$)≥1), and a ratio of the content of MgO to the content of Al$_2$O$_3$ is equal to or larger than 1.0 and equal to or smaller than 3.2. As described above, the glass 10 contains excessive MgO with respect to Al$_2$O$_3$.

When contents of SiO$_2$, B$_2$O$_3$, Al$_2$O$_3$, and MgO fall within these ranges, and an amount of MgO with respect to Al$_2$O$_3$ falls within this range, a Young's modulus can be increased while reducing a thermal expansion coefficient, so that deflection can be suppressed. When an amount of at least one of $TiO_2$ and $ZrO_2$ falls within this range, the Young's modulus can be increased while reducing the thermal expansion coefficient, so that deflection can be suppressed more preferably. The numerical ranges represented by "to" mean a numerical range including numerical values before and after "to" as a lower limit value and an upper limit value, and the same applies to the cases of using "to" hereinafter.

The glass 10 may contain at least one of CaO, $Na_2O_3$, and $K_2O$ as an optional component. In mol percentage on an oxide basis, assuming that the total amount of the glass 10 is 100%, the glass 10 preferably contains 0% to 8% of CaO, preferably contains 0% to 7% of $Na_2O$, and preferably contains 0% to 6% of $K_2O$. Herein, a case in which the content is 0% indicates a case in which the component is not contained. The glass 10 more preferably contains 0% to 5% of CaO, 0.25% to 5.5% of $Na_2O$, and 0.25% to 4.5% of $K_2O$, and even more preferably contains 0% to 3% of CaO, 0.5% to 4% of $Na_2O$, and 0.5% to 3% of $K_2O$.

When the contents of these components fall within the ranges described above, deflection can be appropriately suppressed.

The glass 10 preferably contains $SiO_2$, $Al_2O_3$, MgO, $B_2O_3$, and $TiO_2$. In this case, in mol percentage on an oxide basis, assuming that the total amount of the glass 10 is 100%, the glass 10 preferably contains 35% to 57% of $SiO_2$, 9.6% to 20% of $Al_2O_3$, 19.5% to 44% of MgO, 0.8% to 7.2% of $B_2O_3$, and 0.3% to 5% of $TiO_2$. When the contents of these compositions fall within the range described above, deflection can be appropriately suppressed.

In mol percentage on an oxide basis, assuming that the total amount of the glass 10 is 100%, the glass 10 preferably contains 35% to 52% of $SiO_2$, 9.6% to 20% of $Al_2O_3$, 24% to 44% of MgO, 0.8% to 4.5% of $B_2O_3$, and 0.3% to 5% of $TiO_2$. When the contents of these compositions fall within the range described above, deflection can be appropriately suppressed by causing a measured Madelung constant m (described later) to be equal to or larger than 1.05 even without performing a slow cooling process (described later), for example. However, the glass 10 having this composition may be subjected to the slow cooling process, or is not necessarily subjected to the slow cooling process.

It is preferable that the glass 10 do not contain a sintered body. That is, the glass 10 is preferably glass that is not a sintered body. Herein, the sintered body indicates a member obtained by heating a plurality of particles at a temperature lower than a melting point to combine the particles with each other. The sintered body includes holes, so that a porosity thereof is high in some degree. However, the glass 10 is not the sintered body, so that a porosity thereof is low, which is normally 0%. However, a minute amount of inevitable pores is allowed to be included. Herein, the porosity is what is called a true porosity, which indicates a value obtained by dividing a sum of capacities of pores (holes) communicating with the outside and pores (holes) not communicating with the outside by a total capacity (apparent capacity). The porosity can be measured according to JIS R 1634, for example.

It is preferable that the glass used for the glass 10 be normally amorphous glass, that is, an amorphous solid. This glass may also be crystallized glass containing crystals on a surface or in an inner part, but amorphous glass is preferred in view of density. Ceramics made by a sintering process have low transmittance and high density, so that it is preferable not to use such ceramics.

Shape of Glass

Next, the following describes a shape of the glass 10. As illustrated in FIG. 1, the glass 10 is a plate-shaped glass substrate including a first surface 12 as one surface and a second surface 14 as another surface. The second surface 14 is a surface on the opposite side of the first surface 12, and is parallel with the first surface 12, for example. The glass 10 may have a disc shape that is circular in a plan view, that is, when viewed from a direction orthogonal to the first surface 12, but may have any shape, not limited to the disc shape. For example, the glass 10 may be a plate having a polygonal shape such as a rectangle.

A thickness D of the glass 10, that is, a length between the first surface 12 and the second surface 14 is preferably 0.1 mm to 2.0 mm, and more preferably 0.1 mm to 0.5 mm. By causing the thickness D to be equal to or larger than 0.1 mm, the glass 10 can be prevented from being excessively thin, and deflection or damage caused by impact can be prevented. By causing the thickness D to be equal to or smaller than 2.0 mm, the glass 10 can be prevented from being heavy, and by causing the thickness D to be equal to or smaller than 0.5 mm, the glass 10 can be prevented from being heavy more preferably.

Measured Madelung constant of glass Regarding the glass 10, the measured Madelung constant m as a parameter represented by the following expression (1A) is equal to or larger than 1.05, preferably equal to or larger than 1.05 and equal to or smaller than 1.35, more preferably equal to or larger than 1.07 and equal to or smaller than 1.30, and even more preferably equal to or larger than 1.10 and equal to or smaller than 1.25.

$$m = E/(2 \cdot V_p \cdot G_t) \tag{1A}$$

Herein, E is a measured value of a Young's modulus (GPa) of the glass 10, $V_p$ is an average atomic packing factor of the glass 10, and $G_t$ is average bond dissociation energy of the glass 10. In the present embodiment, the Young's modulus E of the glass 10 is a value that is measured based on propagation of ultrasonic waves using 38DL PLUS manufactured by Olympus Corporation.

The average atomic packing factor $V_p$ is an average value (arithmetic mean value) of atomic packing factors $V_i$ of respective metal oxides contained in the glass 10. The atomic packing factor $V_i$ of the metal oxide is calculated by the following expression (1B).

$$V_i = 6.02 \cdot 10^{23} \cdot (4/3) \cdot \pi \cdot (x \cdot r_M^3 + y \cdot r_O^3) \tag{1B}$$

Herein, the metal oxide contained in the glass 10 is assumed to be $M_xO_y$. M is a metallic element, O is an oxygen element, x is a valence of the metallic element M, and y is a valence of the oxygen element O.

$r_M$ is a Shannon's ionic radius of the metallic element M in the metal oxide $M_xO_y$, and $r_O$ is a Shannon's ionic radius of the oxygen element O in the metal oxide $M_xO_y$.

The average bond dissociation energy $G_t$ is an average value (arithmetic mean value) of values of bond dissociation energy $G_i$ of the respective metal oxides contained in the glass 10. The bond dissociation energy $G_i$ of the metal oxide is calculated by the following expression (1C).

$$G_i = \tag{1C}$$
$$d_i/M_i \cdot \{x \cdot \Delta Hf(M_{gas}) + y \cdot \Delta Hf(O_{gas}) - \Delta Hf(M_xO_{ycrystal}) - (x+y) \cdot RT\}$$

Herein, $d_i$ is density of the metal oxide $M_xO_y$, $M_i$ (g/mol) is a molecular weight of the metal oxide $M_xO_y$, $\Delta Hf(M_{gas})$ is a standard enthalpy of formation of the metallic element M in a gas state, $\Delta Hf(O_{gas})$ is a standard enthalpy of formation of the oxygen element O in a gas state, and $\Delta Hf$ $(M_xO_{ycrystal})$ is a standard enthalpy of formation of the metal oxide $M_xO_y$. R is a gas constant, and T is an absolute temperature.

In the expression (1A), $(2 \cdot V_p \cdot G_t)$ corresponds to a calculated value of the Young's modulus (GPa) of the glass 10 that is calculated from the composition, so that it can be said that the measured Madelung constant m is a ratio of an actual measured value of the Young's modulus of the glass 10 to the calculated value of the Young's modulus of the glass 10. Regarding the glass 10 according to the present embodiment, when the measured Madelung constant m falls within the range described above, the Young's modulus becomes larger than the calculated value that is expected based on the composition, and deflection can be appropriately suppressed.

The Young's modulus E of the glass 10 is preferably equal to or larger than 95 GPa and equal to or smaller than 150 GPa, more preferably equal to or larger than 100 GPa and equal to or smaller than 130 GPa, and even more preferably equal to or larger than 105 GPa and equal to or smaller than 125 GPa. Due to such a high Young's modulus E, deflection can be appropriately suppressed.

Thermal Expansion Factor of Glass

The thermal expansion factor of the glass 10 is equal to or smaller than 0.7, preferably equal to or larger than 0.45 and equal to or smaller than 0.7, more preferably equal to or larger than 0.5 and equal to or smaller than 0.65, and even more preferably equal to or larger than 0.55 and equal to or smaller than 0.6. The thermal expansion factor is a ratio of a measured value of $\alpha$ (ppm/K) of a linear thermal expansion coefficient of the glass 10 to a calculated value $\alpha_{cal}$ (ppm/K) of the linear thermal expansion coefficient calculated from the composition of the glass 10 (that is, $\alpha/\alpha_{cal}$). The measured value a of the linear thermal expansion coefficient is an average thermal expansion coefficient in a range from 50° C. to 200° C., and is a value that is measured conforming to DIN-51045-1 as a standard for thermal expansion measurement. For example, the value may be measured in a range from 30° C. to 300° C. using a dilatometer (DIL 402 Expedis) manufactured by NETZSCH as a measurement device, and an average thermal expansion coefficient in a range from 50° C. to 200° C. may be used as the measured value $\alpha$ of the linear thermal expansion coefficient.

The following describes the calculated value $\alpha_{cal}$ of the linear thermal expansion coefficient of the glass 10. Hereinafter, a thermal expansion parameter $\alpha_{pi}$ of each of the oxides contained in the glass 10 is assumed to be a value calculated by the following expression (2A). A calculated value $\alpha_{cal}1$ of the linear thermal expansion coefficient of the glass containing only a modified oxide component of a monovalent element contained in the glass 10 is assumed to be a value calculated by the following expression (2B). A calculated value $\alpha_{cal}2$ of the linear thermal expansion coefficient of the glass containing only a modified oxide component of a divalent element contained in the glass 10 is assumed to be a value calculated by the following expression (2C). A calculated value $\alpha_{cal}3$ of the linear thermal expansion coefficient of the glass containing only a modified oxide component of a trivalent element contained in the glass 10 is assumed to be a value calculated by the following expression (2D). In the expressions (2B), (2C), and (2D), $\alpha_p$ is obtained by adding up values that are obtained by multiplying the expression (2A) by a cation ratio of each oxide. That is, for example, $\alpha_p$ in the expression (2B) is a value obtained by adding up, for each monovalent element contained in the glass 10, values obtained by multiplying the thermal expansion parameter $\alpha_{pi}$ of the modified oxide of the monovalent element contained in the glass 10 by the cation ratio of the modified oxide. For example, $\alpha_p$ in the expression (2C) is a value obtained by adding up, for each divalent element contained in the glass 10, values obtained by multiplying the thermal expansion parameter $\alpha_{pi}$ of the modified oxide of the divalent element contained in the glass 10 by the cation ratio of the modified oxide. For example, $\alpha_p$ in the expression (2D) is a value obtained by adding up, for each trivalent element contained in the glass 10, values obtained by multiplying the thermal expansion parameter $\alpha_{pi}$ of the modified oxide of the trivalent element contained in the glass 10 by the cation ratio of the modified oxide. The cation ratio indicates a ratio of the number of cations to a total value of the number of cations and the number of anions contained in the modified oxide (the number of cations/(the number of cations+the number of anions)).

$$\alpha_{pi} = \{ni/(ni-1)\} \cdot \left(Z_{+i} \cdot Z_{-i}/r_{eqi}\right)^{-1} \tag{2A}$$

$$\alpha_{cal}1 = (290 \cdot \alpha_p - 89.6)/10 \tag{2B}$$

$$\alpha_{cal}2 = (300 \cdot \alpha_p - 49.1)/10 \tag{2C}$$

$$\alpha_{cal}3 = (848 \cdot \alpha_p - 234)/10\ 0 \tag{2D}$$

Herein, ni is a Born exponent, $Z_{+i}$ is a cationic charge of the modified oxide, $Z_{-i}$ is an anionic charge of the oxide, and $r_{egi}$ is an equilibrium value of an average distance between a pair of ions of the oxide at a temperature 0 (K). As the thermal expansion parameter $\alpha_{pi}$, described is a result of calculation by using the expression (2A) in literature "Hirohisa Masuda et al., Estimation of Thermal Expansion Coefficient of Silicate Glasses with Compositional Parameter, J. Japan Inst. Metals, Vol. 62, No. 5 (1998), pp. 444-448". For example, the thermal expansion parameter $\alpha_{pi}$ of $Al_2O_3$ may be 0.368, and the thermal expansion parameter $\alpha_p$ of MgO may be 0.601. The modified oxide component of the monovalent element contained in the glass 10 indicates $M_2O$ (for example, $K_2O$), the modified oxide component of the divalent element contained in the glass 10 indicates MO (for example, MgO) and the modified oxide component of the trivalent element contained in the glass 10 indicates $M_2O_3$ (for example, $Y_2O_3$).

In this case, the calculated value $\alpha_{cal}$ of the linear thermal expansion coefficient of the glass 10 is calculated by the following expression (2E).

$$\alpha_{cal} = (M1 \cdot \alpha_{cal}1 + M2 \cdot \alpha_{cal}2 + M3 \cdot \alpha_{cal}3)/\{10 \cdot (M1 + M2 + M3) \tag{2E}$$

M1 is a cation ratio (%) of the content of the modified oxide of the monovalent element, M2 is a cation ratio (%) of the content of the modified oxide of the divalent element, and M3 is a cation ratio (%) of the content of the modified oxide of the trivalent element.

In a case in which the glass 10 does not contain the modified oxide component of the monovalent element, $(M1 \cdot \alpha_{cal}1)$ in a numerator on the right side of the expression (2E) is zero, and M1 in a denominator on the right side is zero. In a case in which the glass 10 does not contain the modified oxide component of the divalent element, $(M2 \cdot \alpha_{cal}2)$ in the numerator on the right side of the expression (2E) is zero, and M2 in the denominator on the right side is zero. In a case in which the glass 10 does not contain the modified oxide component of the trivalent element, $(M1 \cdot \alpha_{cal}1)$ in the numerator on the right side of the expression (2E) is zero, and M3 in the denominator on the right side is zero.

In a case in which the glass 10 contains a plurality of types of modified oxide components of the monovalent element, a value obtained by adding up values each obtained by multiplying the cation ratio of the content of the modified oxide component by $\alpha_{cal}1$ of the modified oxide component of the monovalent element for the respective modified oxide components of the monovalent element is treated as $(M1 \cdot \alpha_{cal}1)$ in the numerator on the right side of the expression (2E), and the cation ratio of the total content of the modified oxide components of the monovalent element is treated as M1 in the denominator on the right side of the expression (2E). Similarly, in a case in which the glass 10 contains a plurality of types of modified oxide components of the divalent element, a value obtained by adding up values each obtained by multiplying the cation ratio of the content of the modified oxide component by $\alpha_{cal}2$ of the modified oxide component of the divalent element for the respective modified oxide components of the divalent element is treated as $(M2 \cdot \alpha_{cal}2)$ in the numerator on the right side of the expression (2E), and the cation ratio of the total content of the modified oxide components of the divalent element is treated as M2 in the denominator on the right side of the expression (2E). Similarly, in a case in which the glass 10 contains a plurality of types of modified oxide components of the trivalent element, a value obtained by adding up values each obtained by multiplying the cation ratio of the content of the modified oxide component by $\alpha_{cal}3$ of the modified oxide component of the trivalent element for the respective modified oxide components of the trivalent element is treated as $(M3 \cdot \alpha_{cal}3)$ in the numerator on the right side of the expression (2E), and the cation ratio of the total content of the modified oxide components of the trivalent element is treated as M3 in the denominator on the right side of the expression (2E).

The thermal expansion factor is a ratio of the measured value a of the linear thermal expansion coefficient of the glass 10 to the calculated value $\alpha_{cal}$ of the linear thermal expansion coefficient that is calculated as described above. Regarding the glass 10, when the thermal expansion factor falls within the range described above, the linear thermal expansion coefficient becomes smaller than the calculated value that is expected based on the composition, so that thermal expansion is suppressed, and deflection caused by heat can be appropriately suppressed.

The measured value $\alpha$ of the linear thermal expansion coefficient of the glass 10 is preferably equal to or larger than 3 ppm/K and equal to or smaller than 6 ppm/K, more preferably equal to or larger than 3.1 ppm/K and equal to or smaller than 5.8 ppm/K, and even more preferably equal to or larger than 3.2 ppm/K and equal to or smaller than 5.6 ppm/K. With such a low linear thermal expansion coefficient, deflection can be appropriately suppressed for a wafer on which semiconductors are densely mounted.

Method for Manufacturing Glass

The glass 10 is manufactured as follows. For example, a raw material such as silica sand or sodium carbonate as a raw material of a compound contained in the glass 10 is heated at a predetermined temperature (for example, 1500° C. to 1600° C.) to be melted. After clarifying the melted raw material (glass), a shaping process for shaping the glass in a plate shape is performed. The shaped glass has a composition range of the glass 10 described above on an oxide basis. The glass 10 is then manufactured by performing a slow cooling process on the glass shaped in the shaping process. Herein, the slow cooling process includes a holding process of holding the shaped glass at a predetermined heating temperature for a predetermined holding time, and a cooling process of cooling the glass that has been held at the heating temperature for the holding time to a predetermined temperature at a predetermined temperature lowering speed.

The heating temperature in the holding process is higher than a glass transition point Tg of the glass 10 by a temperature equal to or higher than 0° C. and equal to or lower than 100° C., preferably by a temperature equal to or higher than 10° C. and equal to or lower than 70° C., and more preferably by a temperature equal to or higher than 20° C. and equal to or lower than 40° C. The holding time in the holding process is longer than 0 hours and equal to or shorter than 10 hours, preferably equal to or longer than 0.25 hours and equal to or shorter than 6 hours, and more preferably equal to or longer than 0.5 hours and equal to or shorter than 2 hours. The temperature lowering speed (cooling speed) in the cooling process is equal to or higher than 0.5° C./min to 100° C./min, preferably equal to or higher than 0.75° C./min to 75° C./min, and more preferably equal to or higher than 1° C./min to 50° C./min. By performing the slow cooling process under the conditions described above, the measured Madelung constant m of the glass 10 having the composition described in the present embodiment can be caused to be equal to or larger than 1.05, and deflection can be appropriately suppressed. The predetermined temperature as a temperature at which cooling is completed in the cooling process may be any temperature, for example, a room temperature (for example, 20° C.).

The method for manufacturing the glass 10 is not limited to the method described above, but may be any method. For example, the slow cooling process is not necessarily performed. As the shaping process for manufacturing the glass 10, various kinds of methods can be employed. For example, a melting and casting method, a down-draw method (for example, an overflow down-draw method, a slot-down method, and a redraw method), a float method, a roll-out method, a press method, and the like can be exemplified.

Next, the following describes an example of a manufacturing process in a case of using the glass 10 for manufacturing the FOWLP. In manufacturing the FOWLP, a plurality of semiconductor chips are bonded onto the glass 10, and the semiconductor chips are covered with a sealing material to form an element substrate. The glass 10 and the element substrate are then separated from each other, and a side of the element substrate opposite to the semiconductor chips is bonded onto other glass 10, for example. Subsequently, wiring, a solder bump, and the like are formed on the semiconductor chip, and the element substrate and the glass 10 are separated from each other again. The element substrate is then cut and diced for each semiconductor chip to obtain a semiconductor device.

As described above, regarding the glass 10 according to the present embodiment, in mol percentage on an oxide basis, $SiO_2$: 35% to 60%, $B_2O_3$: 0.8% to 8%, $Al_2O_3$: 6% to 21%, and MgO: 17% to 44% are contained therein, $(MgO/Al_2O_3) \geq 1$ is satisfied, the measured Madelung constant m calculated by the expression (1A) is equal to or larger than 1.05, and the thermal expansion factor as the ratio of the measured value a (ppm/K) of the linear thermal expansion coefficient to the calculated value $\alpha_{cal}$ (ppm/K) of the linear thermal expansion coefficient calculated from the composition is equal to or smaller than 0.7.

Regarding the glass 10 according to the present embodiment, when the contents of $SiO_2$, $B_2O_3$, $Al_2O_3$, and MgO fall within these ranges described above, the content of MgO is larger than that of $Al_2O_3$, the measured Madelung constant m is equal to or larger than 1.05, and the thermal expansion factor is equal to or smaller than 0.7, the Young's modulus can be increased and the linear thermal expansion coefficient can be lowered. Deflection can be suppressed due to the high Young's modulus, and deflection at a high temperature can be suppressed due to the low linear thermal expansion coefficient, so that the glass 10 according to the present embodiment can appropriately suppress deflection.

Assuming that the thermal expansion parameter $\alpha_{pi}$ of the oxide is a value calculated by the expression (2A), the calculated value $\alpha_{cal}1$ of the linear thermal expansion coefficient of the glass containing only the modified oxide component of the monovalent element contained in the glass 10 is a value calculated by the expression (2B), the calculated value $\alpha_{cal}2$ of the linear thermal expansion coefficient of the glass containing only the modified oxide component of the divalent element contained in the glass 10 is a value calculated by the expression (2C), and the calculated value $\alpha_{cal}3$ of the linear thermal expansion coefficient of the glass containing only the modified oxide component of the trivalent element contained in the glass 10 is a value calculated by the expression (2D), the calculated value $\alpha_{cal}$ is calculated by the expression (2E). When the thermal expansion factor as the ratio of the measured value $\alpha$ to the calculated value $\alpha_{cal}$ that is calculated as described above falls within the numerical range described above, the linear thermal expansion coefficient can be lowered, and deflection can be appropriately suppressed.

The measured Madelung constant m is preferably equal to or larger than 1.05 and equal to or smaller than 1.35. When the measured Madelung constant m falls within this range, the Young's modulus can be increased, and deflection can be appropriately suppressed.

The thermal expansion factor is preferably equal to or larger than 0.45 and equal to or smaller than 0.7. When the thermal expansion factor falls within this range, the linear thermal expansion coefficient can be lowered, and deflection can be appropriately suppressed.

In mol percentage on an oxide basis, the glass 10 preferably contains CaO: 0% to 8%, $TiO_2$: 0% to 8%, $ZrO_2$: 0% to 8%, $Na_2O_3$: 0% to 7%, and $K_2O$: 0% to 6%. With such composition, deflection can be appropriately suppressed.

In mol percentage on an oxide basis, the glass 10 preferably contains $SiO_2$: 35% to 52%, $Al_2O_3$: 9.6% to 20%, MgO: 24% to 44%, $B_2O_3$: 0.8% to 4.5%, and $TiO_2$: 0.3% to 5%. With such composition, even if the slow cooling process is not performed, for example, the measured Madelung constant m and the thermal expansion factor can be caused to fall within the range described above, and deflection can be appropriately suppressed.

The glass 10 is preferably glass that is not a sintered body. The glass 10 is not a sintered body, so that the density thereof can be prevented from being excessively increased to reduce the weight. Additionally, light is prevented from being scattered due to pores included in the sintered body, so that light transmittance can be secured.

The glass 10 is preferably amorphous glass. The glass 10 is amorphous glass, so that the density thereof can be prevented from being excessively increased to reduce the weight.

The glass 10 is preferably a support glass substrate for manufacturing the FOWLP and the like, in other words, at least one of the Fan Out Wafer Level Package and the Fan Out Panel Level Package. By using the glass 10 for at least one of manufacture of the Fan Out Wafer Level Package and manufacture of the Fan Out Panel Level Package, a semiconductor package can be preferably manufactured.

The method for manufacturing the glass 10 according to the present embodiment includes: a step of shaping the glass containing $SiO_2$: 35% to 60%, $B_2O_3$: 0.8% to 8%, $Al_2O_3$: 6% to 21%, and MgO: 17% to 44% in mol percentage on an oxide basis; a step of holding the shaped glass at a temperature higher than the glass transition point Tg by a temperature equal to or higher than 0° C. and equal to or lower than 100° C. for a time longer than 0 hours and equal to or shorter than 10 hours; and a step of cooling the glass so that the temperature lowering speed is equal to or higher than 0.5° C./min and equal to or lower than 100° C./min.

According to this manufacturing method, the measured Madelung constant m can be caused to be equal to or larger than 1.05, and the thermal expansion factor can be caused to be equal to or smaller than 0.7, so that deflection of the glass 10 to be manufactured can be suppressed. Means for causing the measured Madelung constant m to be equal to or larger than 1.05 and the thermal expansion factor to be equal to or smaller than 0.7 is not limited to performing this manufacturing method. By way of example, by devising the composition as described above, the measured Madelung constant m can be caused to be equal to or larger than 1.05 and the thermal expansion factor can be caused to be equal to or smaller than 0.7 without performing the slow cooling process.

EXAMPLES

Next, the following describes examples. An implementation aspect may be changed so long as an effect of the invention is exhibited. In the examples, an element plate having a diameter of 320 mm and a thickness of 6 mm was manufactured using a melting and casting method in the shaping process. Next, a plurality of plates each having a diameter of 300 mm and a thickness of 3 mm were cut out from the center of the element plate. Both surfaces of each of these plates were polished by using cerium oxide as a polishing material to obtain the glass. Pieces of glass in the respective examples are different in the composition and whether the slow cooling process is performed after the shaping process. In the slow cooling process, the shaped element plate was held for 1 hour at a temperature higher than the glass transition point by 30° C., and cooled at a cooling speed of 1° C./min. As a sample not to be subjected to the slow cooling process, the shaped element plate was cooled at a cooling speed of 100° C./min.

For the glass of each example, the density was measured by using an Archimedes method, the Young's modulus was measured by using 38DL PLUS manufactured by Olympus Corporation, the calculated value $\alpha_{cal}$ of the linear thermal expansion coefficient was calculated, the measured value a of the linear thermal expansion coefficient was measured, and the thermal expansion factor and the measured Madelung constant m were calculated.

Figure 2:
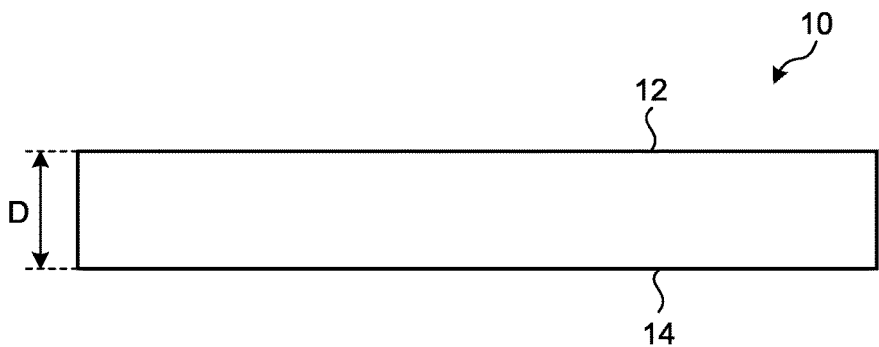
FIG. 2 is a graph illustrating a thermal expansion factor and a measured Madelung constant of each example.

Table 1 to Table 3 are tables indicating glass composition in each example. FIG. 2 is a graph illustrating the thermal expansion factor and the measured Madelung constant of each example.

TABLE 1

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Composition (mol %) | $SiO_2$ | 45.7 | 47.9 | 47.5 | 51.9 | 57.0 | 57.0 | 57.0 | 52.4 | 44.0 | 36.0 | 37.0 |
| | $Al_2O_3$ | 13.9 | 12.1 | 11.0 | 13.9 | 18.5 | 18.5 | 18.5 | 13.4 | 13.0 | 10.0 | 10.0 |
| | $B_2O_3$ | 4.5 | 4.5 | 3.0 | 2.0 | 2.0 | 2.0 | 2.0 | 5.0 | 7.2 | 0.8 | 0.8 |
| | MgO | 34.4 | 34.0 | 32.5 | 28.2 | 19.5 | 20.0 | 19.5 | 28.7 | 35.0 | 44.0 | 43.0 |
| | CaO | | | 1.0 | | 2.3 | | 1.0 | | | 8.0 | 8.0 |
| | $ZrO_2$ | | | | 2.0 | 0.5 | 1.0 | 1.8 | 0.3 | 0.5 | 0.9 | 0.9 |
| | $TiO_2$ | 1.5 | 1.5 | 5.0 | 2.0 | 0.3 | 1.5 | 0.3 | 0.3 | 0.3 | 0.3 | 0.3 |
| | $Na_2O$ | | | | | | | | | | | |
| | $K_2O$ | | | | | | | | | | | |
| Cooling process | | Performed | Performed | Performed | Performed | Performed | Performed | Performed | Performed | Performed | Performed | Performed |
| Density (g/cm$^3$) | | 2.673 | 2.653 | 2.708 | 2.699 | 2.592 | 2.614 | 2.622 | 2.588 | 2.665 | 2.893 | 2.882 |
| Young's modulus (GPa) | | 107.8 | 103.5 | 106.9 | 105.6 | 100.7 | 101.7 | 102.0 | 99.5 | 106.4 | 112.1 | 111.6 |
| Thermal expansion coefficient calculated value $\alpha_{cal}$ (ppm/K) | | 6.8 | 6.7 | 6.7 | 6.3 | 5.9 | 5.7 | 5.8 | 6.3 | 6.8 | 8.5 | 8.4 |
| Thermal expansion coefficient measured value $\alpha$ (ppm/K) | | 3.6 | 4.3 | 4.5 | 3.9 | 3.4 | 3.2 | 3.3 | 3.8 | 4.1 | 5.6 | 5.6 |
| Thermal expansion factor | | 0.527 | 0.644 | 0.676 | 0.627 | 0.572 | 0.559 | 0.566 | 0.608 | 0.598 | 0.662 | 0.659 |
| Measured Madelung constant m | | 1.10 | 1.07 | 1.10 | 1.10 | 1.07 | 1.07 | 1.07 | 1.06 | 1.08 | 1.13 | 1.13 |
| Evaluation result | | A | A | A | A | A | A | A | A | A | A | A |

| | | Example 12 | Example 13 | Example 14 | Example 15 | Example 16 | Example 17 | Example 18 | Example 19 | Example 20 |
|---|---|---|---|---|---|---|---|---|---|---|
| Composition (mol %) | $SiO_2$ | 38.0 | 35.0 | 52.0 | 52.0 | 52.0 | 52.0 | 52.0 | 52.0 | 52.0 |
| | $Al_2O_3$ | 10.0 | 11.0 | 18.0 | 18.0 | 18.0 | 18.0 | 18.0 | 18.0 | 18.0 |
| | $B_2O_3$ | 0.8 | 0.8 | 1.0 | 1.0 | 1.0 | 1.0 | 1.0 | 1.0 | 1.0 |
| | MgO | 42.0 | 44.0 | 24.0 | 26.0 | 26.0 | 26.0 | 26.0 | 26.0 | 26.0 |
| | CaO | 8.0 | 8.0 | | | | | | | |
| | $ZrO_2$ | 0.9 | 0.9 | | | | | | | |
| | $TiO_2$ | 0.3 | 0.3 | 3.0 | 3.0 | 2.5 | 2.0 | 1.5 | 2.5 | 2.0 |
| | $Na_2O$ | | | | 1.5 | | | | 0.5 | 0.5 |
| | $K_2O$ | | | | 0.5 | | 0.5 | 1.0 | 1.5 | 0.5 |
| Cooling process | | Performed | Performed | Performed | Performed | Performed | Performed | Performed | Performed | Performed |
| Density (g/cm$^3$) | | 2.871 | 2.901 | 2.718 | 2.724 | 2.712 | 2.700 | 2.688 | 2.708 | 2.696 |
| Young's modulus (GPa) | | 111.1 | 113.0 | 106.1 | 106.7 | 106.7 | 106.3 | 105.4 | 107.2 | 106.9 |
| Thermal expansion coefficient calculated value $\alpha_{cal}$ (ppm/K) | | 8.3 | 8.5 | 6.5 | 6.2 | 6.3 | 6.5 | 6.7 | 6.3 | 6.5 |
| Thermal expansion coefficient measured value $\alpha$ (ppm/K) | | 5.5 | 5.6 | 3.6 | 3.5 | 3.5 | 3.7 | 4.0 | 3.5 | 3.7 |
| Thermal expansion factor | | 0.656 | 0.654 | 0.552 | 0.561 | 0.554 | 0.569 | 0.601 | 0.561 | 0.572 |
| Measured Madelung constant m | | 1.13 | 1.13 | 1.08 | 1.07 | 1.08 | 1.08 | 1.08 | 1.08 | 1.09 |
| Evaluation result | | A | A | A | A | A | A | A | A | A |

13                                                                                              14

TABLE 2

| | | Example 21 | Example 22 | Example 23 | Example 24 | Example 25 | Example 26 | Example 27 | Example 28 |
|---|---|---|---|---|---|---|---|---|---|
| Composition (mol %) | $SiO_2$ | 52.0 | 52.0 | 52.0 | 52.0 | 52.0 | 52.0 | 52.0 | 52.0 |
| | $Al_2O_3$ | 20.0 | 20.0 | 20.0 | 20.0 | 20.0 | 16.0 | 12.0 | 16.0 |
| | $B_2O_3$ | 1.0 | 1.0 | 1.0 | 1.0 | 1.0 | 1.0 | 1.0 | 1.0 |
| | MgO | 24.0 | 24.0 | 24.0 | 24.0 | 24.0 | 28.0 | 28.0 | 26.0 |
| | CaO | | | | | | | | |
| | $ZrO_2$ | | | | | | | | |
| | $TiO_2$ | 2.5 | 2.0 | 2.5 | 2.0 | 3.0 | 1.5 | 4.0 | 3.0 |
| | $Na_2O$ | 0.5 | 0.5 | | 1.0 | | 1.5 | 1.5 | 0.5 |
| | $K_2O$ | | | 0.5 | 0.5 | | | 1.5 | 1.5 |
| Cooling process | | Performed | Performed | Performed | Performed | Performed | Performed | Performed | Performed |
| Density (g/cm³) | | 2.700 | 2.688 | 2.704 | 2.684 | 2.716 | 2.683 | 2.645 | 2.735 |
| Young's modulus (GPa) | | 108.1 | 108.0 | 107.6 | 108.5 | 107.4 | 106.4 | 96.6 | 103.8 |
| Thermal expansion coefficient calculated value $\alpha_{cal}$ (ppm/K) | | 6.2 | 6.3 | 6.2 | 6.3 | 6.1 | 6.7 | 7.3 | 6.8 |
| Thermal expansion coefficient measured value $\alpha$ (ppm/K) | | 3.4 | 3.6 | 3.4 | 3.6 | 3.4 | 4.2 | 4.2 | 3.7 |
| Thermal expansion factor | | 0.558 | 0.566 | 0.551 | 0.572 | 0.560 | 0.620 | 0.580 | 0.546 |
| Measured Madelung constant m | | 1.09 | 1.09 | 1.08 | 1.10 | 1.07 | 1.11 | 1.05 | 1.06 |
| Evaluation result | | A | A | A | A | A | A | A | A |

| | | Example 29 | Example 30 | Example 31 | Example 32 | Example 33 | Example 34 |
|---|---|---|---|---|---|---|---|
| Composition (mol %) | $SiO_2$ | 52.0 | 52.0 | 47.0 | 46.1 | 47.0 | 47.5 |
| | $Al_2O_3$ | 16.0 | 16.0 | 9.8 | 9.6 | 9.8 | 11.0 |
| | $B_2O_3$ | 1.0 | 1.0 | 1.0 | 1.0 | 1.0 | 3.0 |
| | MgO | 26.0 | 26.0 | 37.2 | 34.6 | 35.3 | 32.5 |
| | CaO | | | 2.0 | 2.0 | | 1.0 |
| | $ZrO_2$ | | | | 2.0 | 2.0 | |
| | $TiO_2$ | 2.5 | 2.0 | 2.0 | 1.0 | 1.0 | 5.0 |
| | $Na_2O$ | 0.5 | 0.5 | 1.0 | 3.8 | 2.0 | |
| | $K_2O$ | 2.0 | 2.5 | | | 2.0 | |
| Cooling process | | Performed | Performed | Performed | Performed | Performed | Not performed |
| Density (g/cm³) | | 2.723 | 2.711 | 2.783 | 2.778 | 2.780 | 2.708 |
| Young's modulus (GPa) | | 103.2 | 102.4 | 107.9 | 104.6 | 102.4 | 103.8 |
| Thermal expansion coefficient calculated value $\alpha_{cal}$ (ppm/K) | | 7.0 | 7.2 | 7.6 | 8.4 | 8.4 | 6.7 |
| Thermal expansion coefficient measured value $\alpha$ (ppm/K) | | 3.9 | 4.2 | 4.4 | 5.1 | 5.4 | 4.5 |
| Thermal expansion factor | | 0.556 | 0.585 | 0.576 | 0.610 | 0.637 | 0.676 |
| Measured Madelung constant m | | 1.07 | 1.07 | 1.12 | 1.12 | 1.09 | 1.07 |
| Evaluation result | | A | A | A | A | A | A |

TABLE 3

| | | Example 35 | Example 36 | Example 37 | Example 38 | Example 39 | Example 40 | Example 41 | Example 42 | Example 43 | Example 44 |
|---|---|---|---|---|---|---|---|---|---|---|---|
| Composition (mol %) | $SiO_2$ | 71.8 | 71.7 | 69.1 | 67.1 | 68.9 | 68.0 | 66.2 | 64.3 | 66.5 | 55.6 |
| | $Al_2O_3$ | 14.2 | 14.3 | 5.1 | 5.0 | 5.0 | 5.0 | 10.9 | 8.4 | 11.5 | 22.2 |
| | $B_2O_3$ | | | 12.4 | 12.0 | 7.8 | 12.2 | 9.3 | | 0.5 | |

TABLE 3-continued

| | | | | | | | | | | | |
|---|---|---|---|---|---|---|---|---|---|---|
| MgO | | 1.1 | | | | | 1.3 | 3.3 | 4.8 | 22.2 |
| CaO | | | 3.8 | 3.6 | 3.6 | 3.6 | 9.5 | 2.4 | | |
| SrO | | | | | | | 2.8 | | | |
| BaO | 0.6 | 0.5 | | | | | | | | |
| $Li_2O$ | 9.2 | 8.1 | | | | | | | | |
| $ZrO_2$ | 1.2 | 1.2 | | | | | | 2.4 | | |
| $TiO_2$ | 1.6 | 1.6 | | | | | | | | |
| $Na_2O$ | 0.5 | 0.4 | 9.0 | 11.6 | 13.9 | 10.4 | | 15.5 | 15.2 | |
| $K_2O$ | 0.2 | 0.2 | | | | | | 3.9 | 1.4 | |
| $Y_2O_3$ | | | | | | | | | | |
| $Gd_2O_3$ | | | | | | | | | | |
| $P_2O_5$ | 0.6 | 0.6 | | | | | | | | |
| ZnO | | | 0.7 | 0.7 | 0.7 | 0.8 | | | | |
| Cooling process | Not per-formed | Not per-formed | Not per-formed | Not per-formed | Not per-formed | Not per-formed | Not per-formed | Not per-formed | Not per-formed | Not per-formed |
| Density $(g/cm^3)$ | 2.430 | 2.430 | 2.390 | 2.430 | 2.470 | 2.410 | 2.460 | 2.540 | 2.450 | 2.628 |
| Young's modulus (GPa) | 80.0 | 85.0 | 71.0 | 74.0 | 75.0 | 75.0 | 75.0 | 75.0 | 71.0 | 101.5 |
| Thermal expansion coefficient calculated value $\alpha_{cal}$ (ppm/K) | 4.4 | 4.2 | 5.3 | 6.3 | 7.5 | 5.9 | 5.0 | 10.5 | 8.9 | 6.0 |
| Thermal expansion coefficient measured value $\alpha$ (ppm/K) | 4.1 | 3.7 | 5.9 | 6.8 | 7.7 | 6.4 | 3.8 | 10.2 | 9.1 | 3.6 |
| Thermal expansion factor | 0.924 | 0.874 | 1.118 | 1.071 | 1.033 | 1.093 | 0.766 | 0.968 | 1.022 | 0.595 |
| Measured Madelung constant m | 0.96 | 1.02 | 0.94 | 0.98 | 1.02 | 1.00 | 0.92 | 1.05 | 0.96 | 1.04 |
| Evaluation result | B | B | B | B | B | B | B | B | B | B |

| | | Exam-ple 45 | Exam-ple 46 | Exam-ple 47 | Exam-ple 48 | Exam-ple 49 | Exam-ple 50 | Exam-ple 51 | Exam-ple 52 |
|---|---|---|---|---|---|---|---|---|---|
| Composition (mol %) | $SiO_2$ | 55.5 | 42.1 | 51.5 | 55.5 | 40.0 | 57.0 | 50.6 | 56.6 |
| | $Al_2O_3$ | 14.7 | 15.4 | 10.3 | 14.7 | 10.0 | 12.0 | 20.7 | 15.1 |
| | $B_2O_3$ | | | | | 6.9 | | | |
| | MgO | 19.6 | 23.0 | 18.4 | 19.6 | 23.9 | 18.0 | 20.7 | 18.0 |
| | CaO | | | | | | | | |
| | SrO | | | | | | | | |
| | BaO | | | | | | | | |
| | $Li_2O$ | | | | | 12.1 | | | |
| | $ZrO_2$ | | | | | | 1.0 | 5.6 | |
| | $TiO_2$ | | | | | 3.8 | | | |
| | $Na_2O$ | 5.2 | 10.3 | 10.0 | 5.2 | | 12.0 | | |
| | $K_2O$ | 5.0 | 9.1 | 9.8 | 5.0 | | | | |
| | $Y_2O_3$ | | | | | | | 2.4 | 10.3 |
| | $Gd_2O_3$ | | | | | | | | |
| | $P_2O_5$ | | | | | 3.4 | | | |
| | ZnO | | | | | | | | |
| Cooling process | | Not per-formed | Not per-formed | Not per-formed | Not per-formed | Not per-formed | Not per-formed | Not per-formed | Not per-formed |
| Density $(g/cm^3)$ | | 2.540 | 2.580 | 2.530 | 2.540 | 2.590 | 2.540 | 2.890 | 3.100 |
| Young's modulus (GPa) | | 84.3 | 82.3 | 75.4 | 84.3 | 96.0 | 82.0 | 102.0 | 113.0 |
| Thermal expansion coefficient calculated value $\alpha_{cal}$ (ppm/K) | | 9.0 | 13.1 | 12.9 | 9.0 | 8.8 | 9.1 | 6.0 | 6.1 |
| Thermal expansion coefficient measured value $\alpha$ (ppm/K) | | 6.9 | 10.1 | 10.7 | 6.9 | 8.0 | 7.5 | 5.5 | 6.8 |
| Thermal expansion factor | | 0.766 | 0.775 | 0.830 | 0.766 | 0.914 | 0.823 | 0.915 | 1.123 |
| Measured Madelung constant m | | 1.01 | 1.03 | 1.01 | 1.01 | 1.02 | 1.02 | 1.02 | 1.21 |
| Evaluation result | | B | B | B | B | B | B | B | B |

Deflection was evaluated for the glass of each example. The glass having a result of deflection evaluation "pass" was assumed to be A, and the glass having a result thereof "failure" was assumed to be B. Pieces of the glass in Example 1 to Example 34 as the examples each have a virtual Madelung constant m equal to or larger than 1.05 and the thermal expansion factor equal to or smaller than 0.7, so that it can be found that the evaluation is A, and deflection can be suppressed. Pieces of the glass in Example 35 to Example 52 as comparative examples do not satisfy at least one of the virtual Madelung constant m equal to or larger than 1.05 and the thermal expansion factor equal to or smaller than 0.7, so that it can be found that the evaluation is B, and deflection cannot be suppressed.

Figure 3:
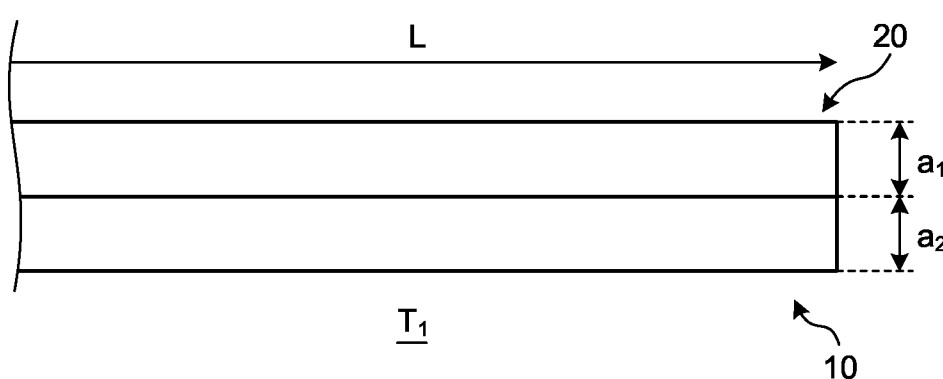
FIG. 3 is a schematic diagram for explaining deflection evaluation.
Figure 3:
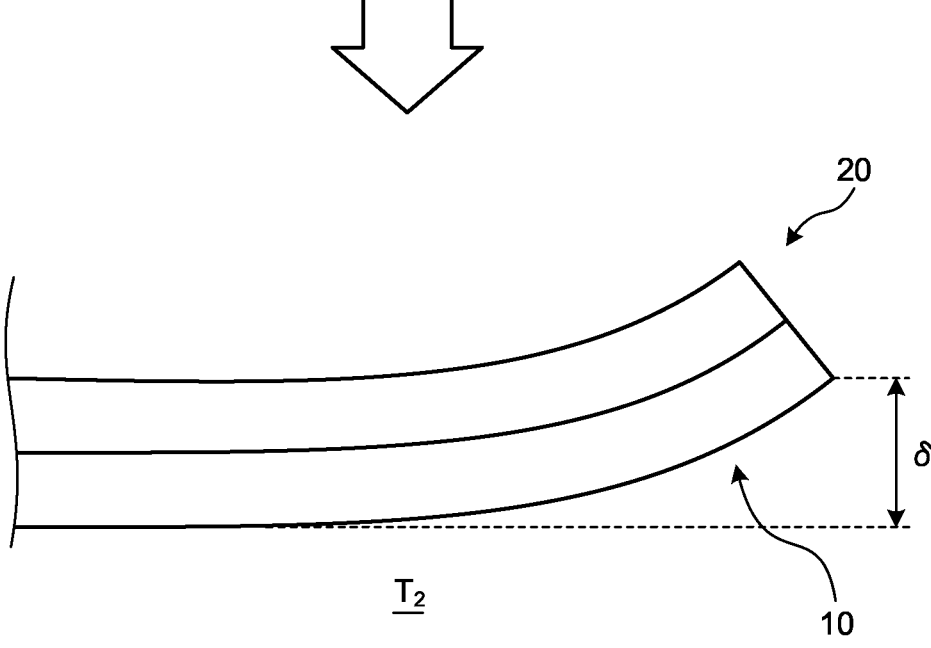

The deflection evaluation was performed based on Bi-Metal warpage calculation that is defined in a literature "S. Timoshenko, J. Opt. Soc. Am. 11 (1925) 233.". FIG. 3 is a schematic diagram for explaining deflection evaluation. Herein, as illustrated in FIG. 3, in a process of molding and bonding a semiconductor substrate with resin on the first surface 12 side of the glass 10 that has been processed to have the shape in FIG. 1, when the glass 10 is cooled from a high-temperature state of 200° C. to a low temperature of 20° C., a warpage amount δ is defined as a displacement amount of an end of the glass 10 in any of vertical upper and lower directions using D/2 (a half of the thickness D) from the center of the second surface 14 as a height reference. Specifically, the warpage amount δ is calculated by the following expression (3).

$$\delta = \frac{6L^2(\alpha_2 - \alpha_1)(T_2 - T_1)(1 + m)^2}{8h[3(1 + m)^2 + (1 + mn)\{m^2 + (mn)^{-1}\}]} \quad (3)$$

Herein, as illustrated in FIG. 3, L is a length of the glass 10 in a warping direction (a lateral direction in FIG. 3), $\alpha_1$ is a linear thermal expansion coefficient of a resin substrate 20, $\alpha_2$ is a linear thermal expansion coefficient of the glass 10, $T_2$ is a temperature after cooling (herein, 20° C.), and $T_1$ is a temperature before cooling (herein, 200° C.). Additionally, m is $\alpha_1/\alpha_2$, h is $a_1 + a_2$, and n is $E_1/E_2$. Herein, $\alpha_1$ is a thickness of the resin substrate 20, $\alpha_2$ is a thickness of the glass 10, $E_1$ is a Young's modulus of the resin substrate 20, and $E_2$ is a Young's modulus of the glass 10.

The deflection evaluation was performed assuming that semiconductors are densely mounted on the resin substrate 20 to be bonded to the glass 10, and the resin substrate 20 was assumed to have a thickness of 0.3 mm, a Young's modulus of 31.5 GPa, and a linear thermal expansion coefficient of 2.38 ppm/K. Additionally, evaluation was performed by performing calculation assuming that the glass 10 had a thickness of 0.5 mm, a Young's modulus of 95 GPa, and a linear thermal expansion coefficient of 10 ppm/K. L was assumed to be 300 mm.

As standards for the deflection evaluation, evaluation A was determined when a standardized warpage amount δ/δstd using a warpage amount δstd at the time when the calculated Madelung constant m and the thermal expansion factor were both 1 was equal to or smaller than 0.600, and a warpage reduction rate (a warpage reduction amount/a change amount of the thermal expansion factor) at the time when the thermal expansion factor was changed with respect to a certain calculated Madelung constant was smaller than 1.300. On the other hand, evaluation B was determined when at least one of these standards was not satisfied. By forming the semiconductor substrate using the glass satisfying the standards for evaluation A, warpage can be effectively reduced, and semiconductors can be densely mounted with high accuracy.

According to the present invention, deflection can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. Glass A glass containing:
$SiO_2$: 35% to 60%;
$B_2O_3$: 0.8% to 8%;
$Al_2O_3$: 6% to 21%; and
MgO: 17% to 44% and
$TiO_2$: 0.3% to 8%,
in mol percentage on an oxide basis, wherein $(MgO/Al_2O_3) \geq 1$ is satisfied,
a measured Madelung constant m calculated by an expression (1A) is equal to or larger than 1.05, $$m = E/(2 \cdot V_p \cdot G_t) \quad (1A)$$

where E is a measured value of a Young's modulus (GPa) of the glass, $V_p$ is an average atomic packing factor of the glass, and G, is average bond dissociation energy of the glass, and a thermal expansion factor as a ratio of a measured value α (ppm/K) of a linear thermal expansion coefficient to a calculated value $\alpha_{cal}$ (ppm/K) of the linear thermal expansion coefficient calculated from composition is equal to or smaller than 0.7.

2. The glass according to claim 1, wherein assuming that a thermal expansion parameter $\alpha_{pi}$ of an oxide is a value calculated by the following expression (2A), a calculated value $\alpha_{cal}$ of a linear thermal expansion coefficient of glass containing only a modified oxide component of a monovalent element contained in the glass is a value calculated by the following expression (2B), a calculated value $\alpha_{cal}2$ of a linear thermal expansion coefficient of glass containing only a modified oxide component of a divalent element contained in the glass is a value calculated by the following expression (2C), and a calculated value $\alpha_{cal}3$ of a linear thermal expansion coefficient of glass containing only a modified oxide component of a trivalent element contained in the glass is a value calculated by the following expression (2D), the calculated value deal is calculated by the following expression (2E), $$\alpha_{pi} = \{ni/(ni - 1)\} \cdot (Z_{+i} \cdot Z_{-i}/r_{eqi})^{-1} \quad (2A)$$

$$\alpha_{cal}1 = (290 \cdot \alpha_p - 89.6)/10 \quad (2B)$$

$$\alpha_{cal}2 = (300 \cdot \alpha_p - 49.1)/10 \quad (2C)$$

$$\alpha_{cal}3 = (848 \cdot \alpha_p - 234)/10 \quad (2D)$$

$$\alpha_{cal} = (M1 \cdot \alpha_{cal}1 + M2 \cdot \alpha_{cal}2 + M3 \cdot \alpha_{cal}3)/\{10 \cdot (M1 + M2 + M3) \quad (2E)$$

where ni is a Born exponent, $Z_{+i}$ is a cationic charge of the oxide, $Z_{-i}$ is an anionic charge of the oxide, $r_{eqi}$ is an equilibrium value of an average distance between a pair of ions of the oxide at a temperature 0 (K), $\alpha_p$ in the expressions (2B), (2C), and (2D) is a numerical value obtained by adding up values that are obtained by multiplying the expression (2A) by a cation ratio of each oxide, M1 is a cation ratio (%) of a content of a modified oxide of the monovalent element, M2 is a cation ratio (%) of a content of a modified oxide of the divalent element, and M3 is a cation ratio (%) of a content of a modified oxide of the trivalent element.

3. The glass according to claim 1, wherein the measured Madelung constant m is equal to or smaller than 1.35.

4. The glass according to claim 1, wherein the thermal expansion factor is equal to or larger than 0.45.

5. The glass according to claim 1, containing:

CaO: 0% to 8%, $TiO_2$: 0.3% to 8%, $ZrO_2$: 0% to 8%, $Na_2O_3$: 0% to 7%, and $K_2O$: 0% to 6%, in mol percentage on an oxide basis.

6. The glass according to claim 1, containing:

$SiO_2$: 35% to 52%, $Al_2O_3$: 9.6% to 20%,

MgO: 24% to 44%, $B_2O_3$: 0.8% to 4.5%, and $TiO_2$: 0.3% to 5%, in mol percentage on an oxide basis.

7. The glass according to claim 1, wherein the glass is amorphous glass.

8. The glass according to claim 1, wherein the glass is a support glass substrate for manufacturing at least one of a Fan Out Wafer Level Package and a Fan Out Panel Level Package.

9. A method for manufacturing the glass of claim 1, the method comprising:

shaping glass, the glass containing:

$SiO_2$: 35% to 60%, $B_2O_3$: 0.8% to 8%, $Al_2O_3$: 6% to 21%, and

MgO: 17% to 44%, and $TiO_2$: 0.3% to 8%, in mol percentage on an oxide basis;

holding the shaped glass at a temperature higher than a glass transition point Tg by a temperature equal to or higher than 0° C. and equal to or lower than 100° C. for a time longer than 0 hours and equal to or shorter than 10 hours; and cooling the glass so that a temperature lowering speed is equal to or higher than 0.5° C./min and equal to or lower than 100° C./min.

* * * * *